(12) United States Patent
Suzuki et al.

(10) Patent No.: US 12,012,575 B2
(45) Date of Patent: Jun. 18, 2024

(54) COMPOSITION FOR SURFACE TREATMENT, METHOD FOR PRODUCING THE SAME, SURFACE TREATMENT METHOD, AND METHOD FOR PRODUCING SEMICONDUCTOR SUBSTRATE

(71) Applicant: FUJIMI INCORPORATED, Kiyosu (JP)

(72) Inventors: Keita Suzuki, Kiyosu (JP); Yohei Takahashi, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 127 days.

(21) Appl. No.: 17/429,471

(22) PCT Filed: Jan. 6, 2020

(86) PCT No.: PCT/JP2020/000058
§ 371 (c)(1),
(2) Date: Aug. 9, 2021

(87) PCT Pub. No.: WO2020/194978
PCT Pub. Date: Oct. 1, 2020

(65) Prior Publication Data
US 2022/0089981 A1   Mar. 24, 2022

(30) Foreign Application Priority Data

Mar. 26, 2019 (JP) ................................. 2019-058832

(51) Int. Cl.
| | | |
|---|---|---|
| C11D 7/02 | (2006.01) | |
| C11D 7/26 | (2006.01) | |
| H01L 21/02 | (2006.01) | |
| H01L 21/306 | (2006.01) | |

(52) U.S. Cl.
CPC ............... *C11D 7/02* (2013.01); *C11D 7/261* (2013.01); *H01L 21/02052* (2013.01); *H01L 21/30625* (2013.01)

(58) Field of Classification Search
CPC ....... C11D 7/02; C11D 7/261; C11D 11/0047; C11D 11/0094; C11D 17/0008; C11D 7/22; C11D 7/50; H01L 21/02052; H01L 21/30625; H01L 21/02074; H01L 21/02065; H01L 21/0205
See application file for complete search history.

(56) References Cited

U.S. PATENT DOCUMENTS

| | | | | |
|---|---|---|---|---|
| 6,082,373 A | * | 7/2000 | Sakurai | H01L 21/02074 134/102.1 |
| 2003/0137052 A1 | * | 7/2003 | Horiuchi | H01L 21/3212 257/E21.582 |
| 2004/0256358 A1 | * | 12/2004 | Shimizu | H01L 21/02052 257/E21.255 |
| 2005/0245080 A1 | * | 11/2005 | Wang | H01L 21/02074 438/626 |
| 2009/0001315 A1 | | 1/2009 | Ishikawa | |
| 2009/0023231 A1 | * | 1/2009 | Ohmi | H01L 21/02052 257/E21.228 |
| 2012/0325927 A1 | * | 12/2012 | Tokoshima | H01L 21/02052 239/8 |
| 2015/0303053 A1 | * | 10/2015 | Tokoshima | H01L 21/02052 210/760 |
| 2019/0002802 A1 | | 1/2019 | Daeschlein et al. | |
| 2019/0390139 A1 | * | 12/2019 | Tamboli | C11D 3/2082 |

FOREIGN PATENT DOCUMENTS

| | | | | |
|---|---|---|---|---|
| CN | 108431931 A | * | 8/2018 | ......... C11D 11/0047 |
| JP | 2001-345301 A | | 12/2001 | |
| JP | 2001345301 A | * | 12/2001 | |
| JP | 2008-071799 A | | 3/2008 | |
| JP | 2008-305900 A | | 12/2008 | |
| TW | 200408499 A | | 6/2004 | |
| TW | 201732024 A | | 9/2017 | |

OTHER PUBLICATIONS

Baumann et al., CN-108431931-A, Machine Translation (Year: 2023).*
Morita, JP-2001345301-A, Machine Translation. (Year: 2024).*
Office Action issued in corresponding Taiwanese Patent Application No. 109104862 dated Jun. 1, 2023 (15 pages).
Office Action issued in corresponding Japanese Patent Application No. 2021-508779 dated Jun. 6, 2023 (8 pages).

* cited by examiner

*Primary Examiner* — Duy Vu N Deo
*Assistant Examiner* — Christopher Remavege
(74) *Attorney, Agent, or Firm* — FOLEY & LARDNER LLP

(57) ABSTRACT

The present invention provides a means capable of improving a residue removing effect and improving storage stability in a composition for surface treatment which is used for reducing residues on a surface of an object to be polished after being polished chemical mechanical polishing. The present invention relates to a composition for surface treatment, wherein the composition contains a solvent and a dissolved gas, a concentration of the dissolved gas is 0.01 mg/L or more and 10 mg/L or less with respect to a total volume of the composition and the composition is used for reducing residues on a surface of an object to be polished after being polished by chemical mechanical polishing.

13 Claims, No Drawings

COMPOSITION FOR SURFACE TREATMENT, METHOD FOR PRODUCING THE SAME, SURFACE TREATMENT METHOD, AND METHOD FOR PRODUCING SEMICONDUCTOR SUBSTRATE

TECHNICAL FIELD

The present invention relates to a composition for surface treatment, a method for producing the same, a surface treatment method, and a method for producing a semiconductor substrate.

BACKGROUND ART

In recent years, along with multilayer wiring on a surface of a semiconductor substrate, so-called chemical mechanical polishing (CMP) technologies of physically polishing and flattening a semiconductor substrate are utilized in the production of a device. CMP is a method for flattening a surface of an object to be polished (material to be polished) such as a semiconductor substrate using a polishing composition (slurry) containing abrasive grains such as silica, alumina, or ceria, an anticorrosive, a surfactant, or the like. The object to be polished (material to be polished) is silicon, polysilicon, silicon oxide, silicon nitride, a wiring or a plug made of a metal or the like, or the like.

Impurities (residues) remain, in a large amount, on the surface of the semiconductor substrate after the CMP step. Examples of the residues include abrasive grains derived from the polishing composition used in CMP, metals, organic substances such as anticorrosives or surfactants, silicon-containing materials and metals produced by polishing silicon-containing materials which are objects to be polished, metal wirings, plugs, and the like, and, further, organic substances such as pad scraps produced from various pads, and the like.

Contamination of the surface of the semiconductor substrate with these residues may adversely affect the electrical characteristics of the semiconductor and reduce the reliability of the device. Therefore, it is desirable to introduce a surface treatment step after the CMP step to remove these residues from the surface of the semiconductor substrate.

As a composition used for cleaning a semiconductor substrate, JP 2008-305900 A (corresponding to US 2009/0001315 A) discloses a water-soluble composition containing a specific chelating agent and an alkali component.

SUMMARY OF INVENTION

However, the water-soluble composition of JP 2008-305900 A (corresponding to US 2009/0001315A) uses a specific chelating agent in order to exhibit its performance, and there is a problem that the storage stability may be insufficient depending on the amount thereof to be added and the combination with other components.

Therefore, an object of the present invention is to provide a means capable of improving a residue removing effect and improving storage stability in a composition for surface treatment which is used for reducing residues on a surface of an object to be polished after being polished by chemical mechanical polishing (that is, polished object to be polished which is an object to be polished after being polished by chemical mechanical polishing: chemically mechanically polished object to be polished).

The above problem of the present invention can be solved by the following means:
a composition for surface treatment,
wherein the composition contains a solvent and a dissolved gas,
a concentration of the dissolved gas is 0.01 mg/L or more and 10 mg/L or less with respect to a total volume of the composition, and
the composition is used for reducing residues on a surface of an object to be polished after being polished by chemical mechanical polishing.

DESCRIPTION OF EMBODIMENTS

Hereinafter, the present invention will be described. Note that the present invention is not limited only to the following embodiments. In the present specification, "X to Y" indicating a range means "X or more and Y or less". In the present specification, unless otherwise specified, operations and measurements of physical properties and the like are performed under the conditions of room temperature (20 to 25° C.)/relative humidity 40 to 50% RH.

Further, "(meth)acrylate" is a generic term for acrylate and methacrylate. Similarly, a compound including (meth), such as (meth)acrylic acid, is a generic term for a compound having "meth" in the name and a compound not having "meth" in the name.

Composition for Surface Treatment

An aspect of the present invention relates to a composition for surface treatment, wherein the composition contains a solvent and a dissolved gas, a concentration of the dissolved gas is 0.01 mg/L or more and 10 mg/L or less with respect to a total volume of the composition, and the composition is used for reducing residues on a surface of an object to be polished after being polished by chemical mechanical polishing, the composition. According to an aspect of the present invention, it is possible to provide a means capable of improving a residue removing effect and improving storage stability in a composition for surface treatment which is used for reducing residues on a surface of an object to be polished after being polished by chemical mechanical polishing.

The present inventors presume a mechanism by which the residue removing effect and the storage stability of the composition for surface treatment can be improved by virtue of such a constitution as follows.

When the composition for surface treatment contains a dissolved gas in a concentration exceeding a predetermined concentration, a reaction occurs between a highly reactive gas such as an oxygen gas in the dissolved gas and components other than the dissolved gas, so that the residue removing effect may be deteriorated. Furthermore, when the composition for surface treatment contains water as a solvent (dispersing medium), the pH value may be changed by carbon dioxide in the dissolved gas. Thus, the composition for surface treatment is deteriorated, and the residues or the surface of the object to be polished after being polished are/is deteriorated, so that the residues are not sufficiently removed. On the other hand, in an embodiment of the present invention, the concentration of the dissolved gas is set to a predetermined value or less. As a result, the amounts of a highly reactive gas such as oxygen gas and carbon dioxide gas are also reduced, and an unintended reaction and a pH change are less likely to occur. Therefore, the performance is hardly changed even after long-term storage, and the storage stability is improved.

However, a mere low concentration of the dissolved gas in the composition for surface treatment is not sufficient. The dissolved gas also acts to enhance the residue removing effect. The reason for this is considered to be because foaming and foam breakage occur due to the presence of the dissolved gas, and mechanical energy due to a pressure wave generated at the time of foam breakage propagates to the surface of the object to be polished after being polished and the residues attached to the surface, so that the residues are removed from the surface of the object to be polished after being polished, although details are unknown. Therefore, in an embodiment of the present invention, by setting the lower limit value of the concentration of the dissolved gas to a predetermined value or more and setting the concentration of the dissolved gas to be within a predetermined range, both an excellent residue removing effect and excellent storage stability can be achieved.

Note that the mechanism is based on presumption, and the present invention is not limited to the mechanism at all. Hereinafter, the constitution of a composition for surface treatment according to an embodiment of the present invention will be described in detail.

(Dissolved Gas)

In the composition for surface treatment according to an embodiment of the present invention, the concentration of the dissolved gas is 0.01 mg/L or more and 10 mg/L or less with respect to the total volume of the composition for surface treatment. When the concentration of the dissolved gas exceeds 10 mg/L with respect to the total volume of the composition for surface treatment, the residue reducing effect by the composition for surface treatment may be reduced over time. In the present specification, a degree of the residue reducing effect by the composition for surface treatment over time is referred to as storage stability, and the smaller the degree of reduction in residue reducing effect over time, the better the storage stability. In addition, when the concentration of the dissolved gas is less than 0.01 mg/L with respect to the total volume of the composition for surface treatment, the residue removing effect may be insufficient.

From the viewpoint of further improving such storage stability, the concentration of the dissolved gas is preferably as low as possible, and is preferably 7 mg/L or less, more preferably 4 mg/L or less, still more preferably 1.5 mg/L or less, and particularly preferably 1.0 mg/L or less, with respect to the total volume of the composition for surface treatment. On the other hand, from the viewpoint of further improving the residue removing effect, the concentration of the dissolved gas is preferably as high as possible, and is preferably 0.05 mg/L or more, and more preferably 0.1 mg/L or more, with respect to the total volume of the composition for surface treatment.

The concentration of the dissolved gas can be controlled by a known method. Among them, it is preferable to perform degassing or to dissolve the dissolved gas so as to achieve a desired concentration after degassing. When the dissolved gas is dissolved after degassing, the type of the dissolved gas is not particularly limited, but is preferably clean air. In the present specification, "clean air" refers to air of Class 8 or lower (Class 8 or lower class) in the ISO standard ISO 14644-1: 2015.

The concentration of the dissolved gas can be controlled by a known method. Among them, it is preferable to perform degassing so as to achieve a desired concentration, or to dissolve the dissolved gas (particularly, clean air) so as to achieve a desired concentration after performing degassing. For example, in a degassing method using a hollow fiber membrane degassing module, the concentration can be controlled by the pressure on the depressurized side and the flow rate of the composition that is an object to be degassed, as will be described later. In a method of supplying a gas (gas) into a solvent or a composition in a sealed container for bubbling which will be described later, the concentration of the dissolved gas can be controlled by the pressure of the pressurized gas at the time of supplying the gas (at the time of press-fitting), as will be described later.

The concentration of the dissolved gas in the composition for surface treatment can be evaluated as the total value of the concentrations of oxygen gas ($O_2$ gas), nitrogen gas ($N_2$ gas), and carbon dioxide gas ($CO_2$ gas) measured. Here, the concentration of the oxygen gas can be measured using, for example, a dissolved oxygen meter (SevenGo Pro, manufactured by Mettler Toledo). The concentrations of the nitrogen gas and the carbon dioxide gas can be measured using, for example, a gas chromatograph (GC-6AM, manufactured by Shimadzu Corporation). Specifically, the gas chromatographic measurement can be performed by collecting 10 μL of a solution or dispersion (composition for surface treatment) with a syringe every 5 minutes and analyzing nitrogen gas and carbon dioxide gas under the following conditions:

Column: Porapak Q (3.0 mm i.D.×2.0 m, manufactured by Shimadzu Corporation),

Column temperature: 140° C.,

Carrier gas: helium,

Flow rate: 40 mL/min, and

Detector: thermal conductivity type detector.

(Solvent)

The composition for surface treatment according to an embodiment of the present invention contains a solvent (dispersing medium). The solvent has a function of dispersing or dissolving each component.

The solvent preferably contains water, and more preferably only water. The water is preferably water that does not contain impurities as much as possible from the viewpoint of inhibiting contamination of the object to be polished after being polished and the action of other components. For example, water having a total content of transition metal ions of 100 ppb or less is preferable. Here, the purity of the water can be increased, for example, by operations such as removal of impurity ions using an ion exchange resin, removal of foreign substances by a filter, and distillation. Specifically, as the water, for example, deionized water (ion-exchanged water), pure water, ultrapure water, distilled water, or the like is preferably used.

The solvent may include an organic solvent. The organic solvent is not particularly limited, and examples thereof include acetone, acetonitrile, ethanol, methanol, isopropanol, glycerin, ethylene glycol, propylene glycol, and the like. The organic solvents may be used singly, or two or more types thereof may be used in combination.

The solvent may be a mixed solvent of water and an organic solvent for dispersing or dissolving each component. In this case, the organic solvent to be used is preferably an organic solvent miscible with water, and more preferably the organic solvent exemplified above. These organic solvents may be used without being mixed with water to disperse or dissolve each component, and then mixed with water.

(Water-soluble Polymer)

The composition for surface treatment according to an embodiment of the present invention preferably further contains a water-soluble polymer. The water-soluble polymer has a function of further improving the residue reducing effect.

When the concentration of the dissolved gas is within the range of the present invention, high storage stability can be achieved even when the composition for surface treatment further contains a water-soluble polymer.

In the present specification, the term "water-soluble" means that the solubility in water (25° C.) is 1 g/100 mL or more, and the term "polymer" refers to a (co)polymer having a weight average molecular weight of 1,000 or more. The weight average molecular weight of the water-soluble polymer is not particularly limited, but is preferably 1,500 or more and more preferably 2,000 or more from the viewpoint of improving the residue removing effect. In addition, it is preferably 1,000,000 or less, more preferably 500,000 or less, and still more preferably 100,000 or less. Here, the weight average molecular weight can be measured by gel permeation chromatography (GPC), and can be calculated, for example, as a value in terms of polyethylene glycol.

The water-soluble polymer is not particularly limited, and a water-soluble polymer having at least one functional group selected from the group consisting of a cationic group, an anionic group, and a nonionic group in the molecule can be used. Examples of the water-soluble polymer include a water-soluble polymer having an anionic group, a water-soluble polymer having a cationic group, a water-soluble polymer having a nonionic group, and the like. In the present specification, the anionic group means a functional group in which a counter ion is dissociated and becomes an anion. In addition, the cationic group means a functional group in which a counter ion is dissociated or bound to a cation species generated by ionization of another ionic compound and becomes a cation. The nonionic group means a functional group that is not ionized.

The cationic group is not particularly limited, and examples thereof include an amino group, a salt group thereof, and the like. Examples of the water-soluble polymer having a cationic group include cationized cellulose, cationized guar gum, polydimethyldimethylene pyrrolidinium chloride, dimethyldimethylene pyrrolidinium chloride•(meth)acrylamide copolymers, (meth)acrylamide•(meth)acrylic acid•dimethyldiallylammonium chloride copolymers, N,N-dimethylaminoethyl (meth)acrylic acid diethyl sulfate, polyethylene glycol N,N-dimethyl (meth)acrylate, and the like.

Examples of the anionic group include a carboxy group, a sulfo group, a phosphate group, a salt group thereof, and the like.

Examples of the water-soluble polymer having a carboxy group or a salt group thereof (carboxy group-containing water-soluble polymer) include poly (meth)acrylic acid, derivatives thereof, salts thereof, and the like.

Examples of the polymer having a sulfo group or a salt group thereof (sulfo group-containing water-soluble polymer) include sulfonic acid-modified polyvinyl alcohols (sulfonic acid group-containing polyvinyl alcohol and sulfonic acid group-containing modified polyvinyl alcohol), sulfonic acid group-containing polystyrene (sulfonic acid group-containing modified polystyrene) such as polystyrene sulfonic acid, sulfonic acid-modified polyvinyl acetate (sulfonic acid group-containing polyvinyl acetate and sulfonic acid group-containing modified polyvinyl acetate), sulfonic acid group-containing polyester (sulfonic acid group-containing modified polyester), and copolymers of a (meth)acrylic group-containing monomer•a sulfonic acid group-containing monomer, such as a copolymer of (meth) acrylic acid•a sulfonic acid group-containing monomer, derivatives thereof, salts thereof, and the like.

Examples of the polymer having a phosphonic acid group ($-P(=O)(OH)_2$) or a salt group thereof (phosphonic acid group-containing water-soluble polymer) include polymers containing a constituent unit composed of 2-hydroxyethyl (meth)acryloyl phosphate, phenyl-2 acryloyloxyethyl phosphate, derivatives thereof, salts thereof, and the like. Further, examples of the polymer include (co)polymers containing a constituent unit composed of a monomer, derivatives thereof, salts thereof, and the like, therein the monomer is such as (meth)acryloyloxymethylphosphoric acid, (meth)acryloyloxyethylphosphoric acid, (meth)acryloyloxypropylphosphoric acid, (meth)acryloyloxybutylphosphoric acid, (meth)acryloyloxypentylphosphoric acid, (meth)acryloyloxyhexylphosphoric acid, (meth)acryloyloxyoctylphosphoric acid, (meth)acryloyloxydecylphosphoric acid, (meth)acryloyloxylaurylphosphoric acid, (meth)acryloyloxystearylphosphoric acid, (meth)acryloyloxy-1,4-dimethylcyclohexylphosphoric acid. Here, the copolymer represents a copolymer or a homopolymer. Examples of the monomer constituting a constituent unit other than the constituent unit of the copolymer include aromatic vinyl compounds such as styrene, α-methyl styrene, vinyltoluene, 2,4-dimethyl styrene, ethyl styrene, phenyl styrene, cyclohexylstyrene, and benzylstyrene; hydroxy group-containing vinyl monomers such as hydroxystyrene, N-methylol (meth)acrylamide, hydroxyethyl (meth)acrylate, hydroxypropyl (meth)acrylate, polyethylene glycol mono (meth)acrylate, and 2-hydroxyethyl propenyl ether; alkyl (meth)acrylates such as methyl (meth)acrylate, ethyl (meth)acrylate, propyl (meth)acrylate, butyl (meth)acrylate, 2-ethylhexyl (meth)acrylate, dodecyl (meth)acrylate, hexadecyl (meth)acrylate, eicosyl (meth)acrylate, and the like. In the present specification, the phrase "having a phosphonic acid group or a salt group thereof" means that the compound may have a partial structure represented as a phosphonic acid group ($-P(=O)(OH)_2$) or a salt thereof, and includes, for example, a case where the phosphonic acid group or salt group thereof is present in the form of a phosphoric acid group ($-O-P(=O)(OH)_2$) or a salt thereof.

Examples of the nonionic group include a hydroxyl group, and the like. Examples of the water-soluble polymer having a nonionic group include a water-soluble polymer containing a hydroxyl group such as a vinyl alcohol-based polymer, a polymer containing an oxyalkylene unit, a cellulose derivative, starch or a derivative thereof, a nitrogen atom-containing polymer having a cyclic structure, and the like.

The vinyl alcohol-based polymer refers to a polymer having a vinyl alcohol unit (structural moiety represented by $-CH_2-CH(OH)-$; hereinafter, also referred to as "VA unit") in one molecule. The vinyl alcohol-based polymer may be a copolymer containing a non-vinyl alcohol unit (structural unit derived from a monomer other than vinyl alcohol, hereinafter also referred to as "non-VA unit") in addition to the VA unit. Examples of the non-VA unit include, but are not particularly limited to, a structural unit derived from ethylene, and the like. When the vinyl alcohol-based polymer contains the non-VA unit, it may contain only one type of non-VA unit or two or more types of non-VA units. The content ratio (molar ratio) between the VA unit and the non-VA unit is not particularly limited, and for example, the VA unit:non-VA unit (molar ratio) is preferably 1:99 to 99:1, and more preferably 95:5 to 50:50. Examples of the vinyl alcohol-based polymer include polyvinyl alcohol (PVA), vinyl alcohol-ethylene copolymers, and the like.

The degree of saponification of the polyvinyl alcohol is not particularly limited, but is preferably 80% or more and 100% or less, more preferably 90% or more and 100% or less, still more preferably 95% or more and 100% or less, and particularly preferably 98% or more and 100% or less.

The polymer having an oxyalkylene unit refers to a polymer containing a (poly)oxyalkylene group. Here, the (poly)oxyalkylene group represents an oxyalkylene group or a polyoxyalkylene group. Examples of the polymer having an oxyalkylene unit include polyalkylene oxides such as polyethylene oxide (PEO), polypropylene oxide (PPO), a block copolymer of ethylene oxide (EO) and propylene oxide (PO), and a random copolymer of EO and PO; various polyalkylene glycol alkyl ethers such as polyethylene glycol oleyl ether and polyethylene glycol dimethyl ether; and polyalkylene glycol alkyl esters such as polyethylene glycol monooctyl ester, polypropylene glycol monostearyl ester, polypropylene glycol distearyl ester, and the like.

The cellulose derivative refers to those in which some of hydroxyl groups of cellulose are substituted with other different substituents. Examples of the cellulose derivative include cellulose derivatives such as hydroxyethyl cellulose (HEC), hydroxypropyl cellulose, hydroxyethyl methyl cellulose, hydroxypropyl methyl cellulose, methyl cellulose, ethyl cellulose, ethyl hydroxyethyl cellulose, carboxymethyl cellulose, and the like.

The starch or derivative thereof refers to starch or those in which some of hydroxyl groups of starch are substituted with other different substituents. Examples of the starch or derivative thereof include pullulan, and the like.

Examples of the nitrogen atom-containing polymer having a cyclic structure include poly N-acryloylmorpholine (PACMO), poly N-vinylpyrrolidone (PVP), poly N-vinylimidazole (PVI), poly N-vinylcarbazole, poly N-vinylcaprolactam, poly N-vinylpiperidine, and the like.

When the water-soluble polymer is in the form of a salt, examples of the salt include, but are not particularly limited to, alkali metal salts such as a sodium salt and a potassium salt, salts of Group 2 elements such as a calcium salt and a magnesium salt, amine salts, ammonium salts, and the like.

One type of the water-soluble polymer may be used alone, or two or more types thereof may be used in combination.

The content of the water-soluble polymer in the composition for surface treatment according to an embodiment of the present invention is not particularly limited, but is preferably 0.001 wt % or more, more preferably 0.01 wt % or more, and still more preferably 0.1 wt % or more from the viewpoint of improving the residue removing effect. In addition, the content of the water-soluble polymer is preferably 10 mass % or less, more preferably 5 mass % or less, and still more preferably 1 mass % or less from the viewpoint of further reducing the possibility that the water-soluble polymer itself remains and becomes an organic residue.

(pH Adjusting Agent)

The composition for surface treatment according to an embodiment of the present invention preferably further contains a pH adjusting agent. The pH adjusting agent acts to set the pH of the composition for surface treatment to a desired value.

The pH adjusting agent is not particularly limited, and a known pH adjusting agent used in the field of compositions for surface treatment can be used. Among these, known acids, bases, salts thereof, or the like are preferably used. Examples of the pH adjusting agent include organic acids such as carboxylic acids such as formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acid, and anthranilic acid, sulfonic acid, and organic phosphonic acid; inorganic acids such as carbonic acid, hydrochloric acid, phosphoric acid, hypophosphorous acid, phosphorous acid, phosphonic acid, boric acid, hydrofluoric acid, orthophosphoric acid, pyrophosphoric acid, polyphosphoric acid, metaphosphoric acid, and hexametaphosphoric acid; hydroxides of alkali metals such as potassium hydroxide (KOH); hydroxides of Group 2 elements; ammonia (ammonium hydroxide); organic bases such as quaternary ammonium hydroxide compounds; and the like. Among them, an organic acid is preferable, a carboxylic acid is more preferable, and maleic acid is still more preferable.

As the pH adjusting agent, a synthetic product may be used, or a commercially available product may be used.

These pH adjusting agents can be used singly, or two or more types thereof can be used in combination.

The content of the pH adjusting agent in the composition for surface treatment may be appropriately selected so as to achieve a desired pH value of the composition for surface treatment, and it is preferable to add an amount so as to achieve a preferred pH value of the composition for surface treatment which will be described later.

(Other Components)

The composition for surface treatment according to an embodiment of the present invention may contain other components in an arbitrary ratio, as necessary, as long as the effects of the present invention are not impaired. However, it is desirable that components other than the essential components of the composition for surface treatment according to an embodiment of the present invention should not be contained as much as possible because they can cause residues. Therefore, the content of the other components is preferably as small as possible, and other components are preferably not substantially contained, and more preferably not contained at all. The other components are not particularly limited, and examples thereof include abrasive grains, a wetting agent, an antiseptic agent, a reducing agent, an oxidizing agent, and the like. For example, in the case of abrasive grains, the phrase "not substantially contain abrasive grains" means that the content of abrasive grains is 0.01 mass % or less with respect to the total mass of the composition for surface treatment.

(pH Value)

The upper limit value of the pH of the composition for surface treatment according to an embodiment of the present invention is not particularly limited, but is preferably 7 or less, more preferably 6 or less, and still more preferably 5 or less. Within this range, corrosion of a metal can be further suppressed even when the surface of the object to be polished after being polished includes a portion formed of the metal, and various objects to be subjected to surface treatment (objects to be polished after being polished) can be used. The lower limit value of the pH is not particularly limited, but is preferably 1 or more, more preferably 2 or more, and still more preferably 3 or more. Within this range, the possibility of deteriorating a polishing apparatus and a consumable member such as a polishing pad in contact is further reduced, and the possibility of generating residues, scratches, and the like due to the product generated by the deterioration is also further reduced. The pH value of the composition for surface treatment can be confirmed by a pH meter (manufactured by HORIBA, Ltd., product name: LAQUA (registered trademark)).

(Method for Producing Composition for Surface Treatment)

Another aspect of the present invention relates to a method for producing the composition for surface treatment described above, including setting the concentration of the dissolved gas to 0.01 mg/L or more and 10 mg/L or less with respect to the total volume of the composition.

The concentration of the dissolved gas can be controlled by a known method. Among them, it is preferable to perform degassing or to dissolve the dissolved gas so as to achieve a desired concentration after degassing.

The degassing method is not particularly limited, and a known method can be used, and examples thereof include a vacuum degassing method, a heating degassing method, an ultrasonic degassing method, a centrifugal degassing method, a degassing method using a hollow fiber membrane degassing module, a method by bubbling a gas other than the above gases, a degassing method in which two or more of these methods are combined, and the like. Among them, a degassing method using a hollow fiber membrane degassing module is preferable. General examples of the degassing method using a hollow fiber membrane degassing module include a method in which, in a state where the composition is circulated inside or outside a hollow fiber membrane, the outside or inside of the hollow fiber membrane on the opposite side is depressurized to move the gas to the depressurized side through the wall surface of the hollow fiber, so that the concentration of the dissolved gas is reduced. According to the degassing method using a hollow fiber membrane degassing module, it is possible to obtain a composition containing almost no gas without changing the composition other than the concentration of the dissolved gas, and it is possible to prepare a composition for surface treatment containing almost no gas other than the above gases by using the composition.

The hollow fiber used in the hollow fiber membrane degassing module is not particularly limited, and a known hollow fiber membrane degassing module can be used. Examples of the hollow fiber membrane degassing module include water degassing/air supplying modules SEPAREL (registered trademark) PF series and EF series manufactured by DIC Corporation, and the like.

The upper limit of the pressure on the depressurized side when the hollow fiber membrane degassing module is used is not particularly limited, but is preferably 10 kPa or less, more preferably 5 kPa or less, and still more preferably 3 kPa or less. Within this range, the dissolved gas concentration can be further reduced. The lower limit of the pressure is not particularly limited, but is preferably 0.01 kPa or more. Within this range, the scope of the equipment to be used can be further expanded, and the dissolved gas concentration can be sufficiently increased.

The lower limit of the flow rate of the composition to be degassed when the hollow fiber membrane degassing module is used is not particularly limited, but is preferably 100 L/h or more, more preferably 250 L/h or more, and still more preferably 500 L/h or more. Within this range, productivity is further improved. The upper limit of the flow rate of the composition to be degassed is not particularly limited, but is preferably 2,000 L/h or less, more preferably 1,500 L/h or less, and still more preferably 1,000 L/h or less. Within this range, the dissolved gas is more easily trapped by the hollow fiber, and the dissolved gas concentration can be further reduced.

The concentration of the dissolved gas after degassing is not particularly limited, but is preferably 0.1 mg/L or less, more preferably 0.05 mg/L or less, and still more preferably 0.01 mg/L or less (lower limit: 0 mg/L) with respect to the total volume of the composition to be degassed (for example, the composition for surface treatment or a composition of the same formulation as the composition for surface treatment, except for the dissolved gas concentration).

The concentration of the dissolved gas after degassing when using the hollow fiber membrane degassing module is preferably controlled by the pressure on the depressurized side and the flow rate of the composition as the object to be degassed. For example, as the pressure on the depressurized side decreases, the concentration of the dissolved gas also decreases, and as the flow rate of the composition decreases, the concentration of the dissolved gas also decreases.

When the dissolved gas is dissolved after degassing, the type of the dissolved gas is not particularly limited, but is preferably clean air.

The method for dissolving the dissolved gas is not particularly limited, and a known method can be used, and examples thereof include a method in which a solvent or a composition is dropped into a sealed container filled with a gas, a method in which a gas (gas) is supplied into a solvent or composition in a sealed container and bubbled, a method in which a gas is pressurized and supplied to a gas phase chamber of a gas dissolving membrane module using a gas dissolving membrane module and dissolved in a solvent or composition in a liquid phase chamber, and the like. Among them, the method of supplying a gas into a solvent or composition in a sealed container and bubbling the gas is preferably used.

As the sealed container, for example, the compact vacuum container NT-20R manufactured by AS ONE Corporation can be used.

The pressure of the pressurized gas at the time of gas supply (at the time of press-fitting) in this bubbling is proportional to the degree of saturation of the composition for surface treatment to be prepared, and in general, the pressure of the pressurized gas is preferably 0.01 to 2.0 MPa, and particularly preferably 0.01 to 1.0 MPa. When the pressurized gas pressure is the lower limit value or more, the concentration of the dissolved gas is more easily adjusted. In addition, when the pressure of the pressurized gas is the upper limit value or less, the dissolved gas concentration is more easily adjusted, which is more preferable from the viewpoint of the pressure-resistant structures of the cleaning container and the pressurization equipment.

When the composition for surface treatment contains a solvent (dispersing medium) and a water-soluble polymer, a pH adjusting agent or any other component, the method for producing the composition for surface treatment according to an embodiment of the present invention preferably further includes mixing these components. Then, it is preferable to set the concentration of the dissolved gas to 0.01 mg/L or more and 10 mg/L or less with respect to the total volume of the composition for surface treatment by performing degassing or dissolving the dissolved gas so as to achieve a desired concentration after performing degassing, on the composition obtained by mixing these components.

A mixing method for mixing the respective components is not particularly limited, and a known method can be appropriately used. The mixing temperature is not particularly limited, but is generally preferably 10° C. or higher and lower than 100° C., and heating may be performed in order to increase the rate of dissolution. The mixing time is also not particularly limited. However, when the gas is mixed, the mixing temperature is preferably low, and a cooled composition is preferably used.

The composition for surface treatment according to an embodiment of the present invention is preferably stored under such conditions that the concentration of dissolved gas does not change. Such conditions are not particularly limited, and examples thereof include storage in a sealed container such as the compact vacuum container NT-20R manufactured by AS ONE Corporation, and the like.

Surface Treatment Method

Another aspect of the present invention relates to a surface treatment method including: using the composition for surface treatment, or producing a composition for surface treatment by the method for producing a composition for surface treatment, and using the produced composition for surface treatment to subject an object to be polished after being polished by chemical mechanical polishing to a surface treatment, thereby reducing residues on a surface of the object to be polished after being polished.

In the present specification, the surface treatment refers to a treatment for reducing residues on the surface of the object to be polished after being polished, and represents a treatment for performing cleaning in a broad sense. The surface treatment method according to an embodiment of the present invention is performed by a method of bringing the composition for surface treatment into direct contact with the object to be polished after being polished. The surface treatment is not particularly limited, but is preferably performed, for example, by a rinse polishing treatment or a cleaning treatment.

The surface treatment method according to an embodiment of the present invention is preferably a method by a rinse polishing treatment. The reason for this is because, in the rinse polishing treatment, the residue removing effect by the composition for surface treatment is more remarkably exhibited, although details are unknown.

In the present specification, the rinse polishing treatment refers to a treatment for removing residues on the surface of the object to be polished after being polished by the frictional force (physical action) by the polishing pad and the action of the composition for surface treatment, which is performed on a polishing table (platen) to which the polishing pad is attached. As a specific example of the rinse polishing treatment, there is indicated a treatment of performing final polishing (finish polishing) on the object to be polished, then placing the object to be polished after being polished on a polishing table (platen) of a polishing apparatus, bringing the object to be polished after being polished and a polishing pad into contact with each other, and relatively sliding the object to be polished after being polished and the polishing pad while supplying the composition for surface treatment to the contact portion.

From this, as the surface treatment method according to a preferred embodiment of the present invention, there is indicated a method that, to an object to be polished after being polished by chemical mechanical polishing placed on a polishing table (platen) to which a polishing pad is attached, bringing at least one surface of the object to be polished after being polished and the polishing pad into contact with each other, and relatively sliding the object to be polished after being polished and the polishing pad while supplying a composition for surface treatment to the contact portion.

The rinse polishing treatment is not particularly limited, but it is preferable to perform the rinse polishing treatment using a general polishing apparatus in which a holder for holding the object to be polished, a motor capable of changing the number of rotations, and the like are attached and which has a polishing table to which a polishing pad (polishing cloth) can be pasted. As the polishing apparatus, either a single-side polishing apparatus or a double-side polishing apparatus may be used. As the polishing pad, a general nonwoven fabric, polyurethane, a porous fluororesin, or the like can be used without particular limitation. The polishing pad is preferably grooved such that a polishing liquid is accumulated. When the chemical mechanical polishing and the rinse polishing treatment are performed using the same polishing apparatus, the polishing apparatus preferably includes a discharge nozzle for the composition for surface treatment according to an embodiment of the present invention in addition to a discharge nozzle for the polishing composition.

The rinse polishing conditions are not particularly limited, and appropriate conditions can be appropriately set according to the properties of the composition for surface treatment and the object to be polished after being polished. The rinse polishing load is not particularly limited, but is generally preferably 0.1 psi or more and 10 psi or less, more preferably 0.5 psi or more and 8 psi or less, and still more preferably 1 psi or more and 6 psi or less per unit area of the substrate. Within this range, it is possible to further suppress breakage of the substrate due to a load and generation of defects such as scratches on the surface while obtaining a high residue removing effect. The rotation speed of the table and the rotation speed of a carrier are not particularly limited, but are each generally preferably 10 rpm or more and 500 rpm or less, more preferably 20 rpm or more and 300 rpm or less, and still more preferably 30 rpm or more and 200 rpm or less. The table rotation speed and the carrier rotation speed may be the same or different, but the table rotation speed is preferably larger than the carrier rotation speed. The method for supplying the composition for surface treatment is also not particularly limited, and a method of continuously supplying the composition for surface treatment with a pump or the like (flowing) may be adopted. The supply amount of the composition for surface treatment (flow rate of the composition for surface treatment) is not particularly limited as long as it is a supply amount enough to cover the entire object to be polished after being polished, but is generally preferably 100 mL/min or more and 5,000 mL/min or less. The rinse polishing treatment time is not particularly limited as long as it is appropriately set so as to obtain an intended residue removing effect, but is generally preferably 5 seconds or more and 180 seconds or less.

The surface treatment method may be a method by a cleaning treatment. In the present specification, the cleaning treatment refers to a treatment for removing residues on the surface of the object to be polished after being polished mainly by a chemical action by the composition for surface treatment, which is performed in a state where the object to be polished after being polished is demounted from the polishing table (platen). As a specific example of the cleaning treatment, there is indicated a treatment in which the object to be polished after being polished is demounted from the polishing table (platen) after the final polishing (finish polishing) is performed or after the final polishing is followed by the rinse polishing treatment on the object to polished, and the object to be polished after being polished is brought into contact with the composition for surface treatment. A means for applying frictional force (physical action) to the surface of the object to be polished after being polished, in a contact state between the composition for surface treatment and the object to be polished after being polished may be further used.

The cleaning treatment method, the cleaning treatment apparatus, and the cleaning treatment conditions are not particularly limited, and known methods, apparatuses, conditions, and the like can be appropriately used. The cleaning treatment method is not particularly limited, and examples thereof include a method in which the object to be polished after being polished is immersed in the composition for surface treatment and, as necessary, is subjected to an ultrasonic treatment, a method in which a cleaning brush and the object to be polished after being polished are brought into contact with each other while the object to be polished after being polished is held, and the surface of the object to be polished after being polished is rubbed with the brush while the composition for surface treatment is supplied to the contact portion, and the like.

Cleaning with water may be performed before, after, or both before and after the surface treatment method according to an embodiment of the present invention. Thereafter, water droplets attached to the surface of the object to be polished after being polished may be swept off, and the surface may be dried by a spin dryer, an air blow, or the like.

Method for Producing Semiconductor Substrate

Another aspect of the present invention relates to a method for producing a semiconductor substrate, wherein an object to be polished after being polished is a semiconductor substrate after being polished, and wherein the method includes a surface treatment step of reducing residues on a surface of the semiconductor substrate after being polished by chemical mechanical polishing (that is, polished semiconductor substrate which is the semiconductor substrate after being polished by chemical mechanical polishing: a chemically mechanically polished semiconductor substrate) by the above-described surface treatment method.

The method for producing a semiconductor substrate includes polishing an object to be polished by chemical mechanical polishing (polishing step). Thereafter, the method includes using the composition for surface treatment or using the composition for surface treatment produced by the production method to subject an object to be polished after being polished by chemical mechanical polishing to a surface treatment, thereby reducing residues on the surface of the object to be polished after being polished (surface treatment step). Note that, in the production method, steps that can be adopted in a known method for producing a semiconductor substrate can be appropriately adopted as other steps.

Intended Use

The composition for surface treatment is used to reduce residues on the surface of the object to be polished after being polished by chemical mechanical polishing.
(Object to be Polished After Being Polished)
In the composition for surface treatment, the surface treatment method, and the method for producing a semiconductor substrate, the object to be subjected to surface treatment is the object to be polished after being polished by the chemical mechanical polishing. The reason why the object to be subjected to surface treatment is after being polished by chemical mechanical polishing is that the composition for surface treatment exhibits a particularly high removing effect on residues on the surface of the object to be polished after being polished by chemical mechanical polishing, particularly, abrasive grains remaining after the polishing, residues composed of a substance insoluble in water generated during the polishing, and the like.

The object to be polished (that is, the object to be polished before being polished by chemical mechanical polishing) is not particularly limited, and examples thereof include known objects to be polished used in the CMP field. Therefore, an aspect of the object to be polished is not particularly limited, but a layer that is a flat plate member is preferable, a substrate including the layer is more preferable, and a semiconductor substrate is still more preferable. Examples of the object to be polished include a substrate composed of a single layer, a substrate including a layer to be polished and any other layer (for example, a support layer or any other functional layer), and the like.

In addition, in the object to be polished, the surface to be polished preferably contains at least one selected from the group consisting of a material having a silicon-oxygen bond, a material having a silicon-silicon bond, a material having a silicon-nitrogen bond, tungsten, and a tungsten alloy from the viewpoint of more remarkably exhibiting a residue removing effect. In addition, in the object to be polished, the surface to be polished more preferably contains silicon nitride which is a material having a silicon-nitrogen bond, silicon oxide which is a material having a silicon-oxygen bond, polysilicon, amorphous silicon, and single crystal silicon, which is a material having a silicon-silicon bond, tungsten, and a tungsten alloy (alloy having the largest proportion of the mass of tungsten among the metals constituting the alloy), and further preferably contains silicon oxide. Here, examples of the surface containing silicon oxide include a surface containing a silicon oxide (TEOS-$SiO_2$) film formed by using TEOS (tetraethyl orthosilicate) as a raw material, an HDP film, a USG film, a PSG film, a BPSG film, and an RTO film. Among them, a TEOS-$SiO_2$ film is preferable.
(Residue)
In the present specification, the residue represents impurities attached to the surface of the object to be polished after being polished. The residues are not particularly limited, and examples thereof include organic residues, residues derived from abrasive grains, residues derived from the object to be polished, residues composed of a mixture thereof, and the like. The composition for surface treatment described above has a high removing effect regardless of the type of the residues, and exhibits a particularly high removal effect on, for example, abrasive grains remaining after polishing and residues composed of a substance insoluble in water generated during polishing, among these residues. The number of residues can be confirmed by the wafer defect inspection apparatus SP-2 manufactured by KLA TENCOR. In addition, since the color and shape greatly vary depending on the type of residues, the type of residues can be visually determined by SEM observation. In addition, if necessary, determination may be made by elemental analysis using an energy dispersive X-ray analyzer (EDX).

The embodiments of the present invention have been described in detail, but are illustrative and exemplary and not restrictive, and it is clear that the scope of the present invention should be construed by the appended claims.

The present invention encompasses the following aspects and embodiments.

1. A composition for surface treatment, wherein the composition contains a solvent and a dissolved gas,
   a concentration of the dissolved gas is 0.01 mg/L or more and 10 mg/L or less with respect to a total volume of the composition, and
   the composition is used for reducing residues on a surface of an object to be polished after being polished by chemical mechanical polishing.

2. The composition for surface treatment according to item 1, wherein a pH of the composition is 7 or less.

3. The composition for surface treatment according to item 1 or 2, further containing a water-soluble polymer.

4. A method for producing the composition for surface treatment according to any one of items 1 to 3, including setting the concentration of the dissolved gas to 0.01 mg/L or more and 10 mg/L or less with respect to the total volume of the composition.

5. A surface treatment method including:
   using the composition for surface treatment according to any one of items 1 to 3, or
   producing a composition for surface treatment by the method according to item 4, and using the produced composition for surface treatment
   to subject an object to be polished after being polished by chemical mechanical polishing to a surface treatment, thereby reducing residues on a surface of the object to be polished after being polished.

6. The surface treatment method according to item 5, wherein the surface treatment is performed by a rinse polishing treatment or a cleaning treatment.

7. A method for producing a semiconductor substrate,
   wherein an object to be polished after being polished is a semiconductor substrate after being polished, and
   wherein the method includes a surface treatment step of reducing residues on a surface of the semiconductor substrate after being polished by chemical mechanical polishing by the surface treatment method according to item 5 or 6.

EXAMPLES

The present invention will be described in more detail with reference to the following Examples and Comparative Examples. However, the technical scope of the present invention is not limited only to the following Examples. Unless otherwise specified, "%" and "part" mean "mass %" and "part by mass", respectively.

Preparation of Composition for Surface Treatment

Preparation of Composition 1 for Surface Treatment

A composition was prepared by mixing polyvinyl alcohol (weight average molecular weight: 10,000, degree of saponification: 99%) as a water-soluble polymer, maleic acid as a pH adjusting agent, and water (ultrapure water) as a solvent. Subsequently, the obtained composition was degassed in advance under the condition of a flow rate of 1000 L/h under a vacuum pressure set to 2.7 kPa or less using a water degassing/gas supplying module (SEPAREL (registered trademark) EF-040P manufactured by DIC Corporation) as a hollow fiber membrane degassing module to set the concentration of the dissolved gas to 0.05 mg/L with respect to the total volume of the composition. Then, a clean air gas pressurized to 0.5 MPa was supplied to the composition in a vacuum container (compact vacuum container NT-20R manufactured by AS ONE Corporation) as a sealed container and bubbled to dissolve the composition, thereby obtaining composition 1 for surface treatment in which the concentration of the dissolved gas was 10 mg/L with respect to the total volume of the composition for surface treatment.

Here, the content of polyvinyl alcohol was set to 0.20 mass % with respect to the total mass of composition 1 for surface treatment, and the content of maleic acid was set to an amount such that the pH of composition 1 for surface treatment was 5.

Here, the pH of composition 1 for surface treatment (liquid temperature: 25° C.) was confirmed by the pH meter (manufactured by HORIBA, Ltd., product name: LAQUA (registered trademark)).

In addition, the concentration of the dissolved gas in composition 1 for surface treatment was evaluated as the total value of the concentrations of oxygen gas ($O_2$ gas), nitrogen gas ($N_2$ gas), and carbon dioxide gas ($CO_2$ gas) measured. Here, the concentration of the oxygen gas was measured using a dissolved oxygen meter (SevenGo Pro, manufactured by Mettler Toledo). The concentrations of the nitrogen gas and the carbon dioxide gas were measured using a gas chromatograph (GC-6AM, manufactured by Shimadzu Corporation). In the gas chromatographic measurement, specifically, 10 μL of a solution (composition for surface treatment) was collected by a syringe every 5 minutes and analyzed under the following conditions:

Column: Porapak Q (3.0 mm i.D.×2.0 m, manufactured by Shimadzu Corporation),
Column temperature: 140° C.
Carrier gas: helium,
Flow rate: 40 mL/min, and
Detector: thermal conductivity type detector.

Preparation of Compositions 2 to 5 and 8 for Surface Treatment

Each of compositions 2 to 5 and 8 for surface treatment was prepared in the same manner as in the preparation of composition 1 for surface treatment except that the pressurization condition (pressure of the clean air during bubbling of the clean air in the sealed container) was changed, and that the concentration of the dissolved gas was changed as shown in Table 1 below.

Preparation of Compositions 6 and 7 for Surface Treatment

Compositions 6 and 7 for surface treatment were prepared in the same manner as in the preparation of composition 1 for surface treatment except that the degassing conditions (vacuum pressure and flow rate) were changed, and that bubbling with the clean air gas in the sealed container was not performed to change the concentration of the dissolved gas as shown in Table 1 below.

The formulation of each composition for surface treatment is shown in Table 1 below. In Table 1 below, polyvinyl alcohol is the same as that used in the preparation of composition 1 for surface treatment.

Evaluation of Number of Residues

Chemical Mechanical Polishing (CMP) Step

For a silicon single crystal substrate having a silicon oxide (TEOS-$SiO_2$) film formed from TEOS as a raw material (a silicon single crystal substrate on which a TEOS-$SiO_2$ film was formed, hereinafter, also simply referred to as "TEOS-SiO$_2$ substrate"), as a semiconductor substrate, a substrate surface on the TEOS-SiO$_2$ film side was polished under the following conditions using a polishing composition M (composition: sulfonic acid-modified colloidal silica (prepared by the method described in "Sulfonic acid-functionalized silica through quantitative oxidation of thiol groups", Chem. Commun. 246-247 (2003); primary particle size: 30 nm, secondary particle size: 60 nm): 4 mass %, ammonium sulfate: 1 mass %, maleic acid aqueous solution having a concentration of 30 mass %: 0.018 mass %, solvent: water). Here, as the TEOS-SiO$_2$ substrate, a 300-mm wafer was used.

—Polishing Apparatus and Polishing Conditions—

Polishing apparatus: single-side polishing apparatus FREX300E manufactured by Ebara Corporation Polishing pad: Hard polyurethane pad IC 1010 manufactured by Nitta Haas Incorporated Polishing pressure: 2.0 psi (1 psi=6894.76 Pa; the same applies hereinafter)

Rotation speed of polishing table: 63 rpm

Rotation speed of head: 57 rpm

Supply of polishing composition M: flowing

Amount of polishing composition supplied: 300 mL/min

Polishing time: 60 seconds.

Rinse Polishing Treatment Step

After the substrate surface on the TEOS-SiO$_2$ film side was polished in the CMP step, the polished TEOS-SiO$_2$ substrate was demounted from the polishing table (platen). Subsequently, the polished TEOS-SiO$_2$ substrate was mounted on another polishing table (platen) in the same polishing apparatus, and under the following conditions, the substrate surface on the TEOS-SiO$_2$ film side was subjected to a rinse polishing treatment using each of the compositions for surface treatment prepared above, which were stored under an environment of 25° C. in a vacuum container (compact vacuum container NT-20R manufactured by AS ONE Corporation) as a sealed container so that the concentration of the dissolved gas did not change after preparation and until use. Here, the time from the completion of the preparation of the composition for surface treatment until the sealed container was opened and the composition for surface treatment was placed in the polishing machine and used was within 30 minutes.

—Rinse Polishing Apparatus and Rinse Polishing Conditions—

Polishing apparatus: single-side polishing apparatus FREX300E manufactured by Ebara Corporation Polishing pad: Hard polyurethane pad IC 1010 manufactured by Nitta Haas Incorporated Polishing pressure: 2.0 psi (1 psi=6894.76 Pa, the same applies hereinafter)

Rotation speed of polishing table: 63 rpm

Rotation speed of head: 57 rpm

Supply of compositions 1 to 8 for surface treatment: flowing

Amount of polishing composition supplied: 300 mL/min

Rinse polishing treatment time: 60 seconds.

Water Washing Step

After the rinse polishing, the polished TEOS-SiO$_2$ substrate after being subjected to the rinse polishing treatment obtained above was cleaned, in a cleaning unit, for 60 seconds using a PVA brush while deionized water (DIW) was applied thereto. Thereafter, drying was performed with a spin dryer for 30 seconds.

Measurement of Initial Number of Defects

The number of defects having a size of 0.09 μm or more was measured for the polished TEOS-SiO$_2$ substrate obtained after the water washing step. For the measurement of the number of defects, the wafer defect inspection apparatus SP-2 manufactured by KLA TENCOR was used. The measurement was performed on the remaining portion of the polished TEOS-SiO$_2$ substrate excluding a portion having a width of 5 mm from the outer peripheral end portion of the substrate surface on the TEOS-SiO$_2$ film side (a portion ranging from a width of 0 mm to a width of 5 mm when the outer peripheral end portion was defined as 0 mm). The smaller the number of defects, the smaller the number of residues remaining on the substrate surface, and the number of defects was evaluated according to the following criteria determined in consideration of the yield at the time of producing the substrate. These results are shown in Table 1 below.

○: The number of defects is less than 3,650;

Δ: The number of defects is 3,650 or more and less than 3,900;

x: The number of defects is 3,900 or more.

Evaluation of Number of Defects after Rinse Polishing Treatment Using Composition for Surface Treatment after Storage for 6 Months (Number of Defects after Storage for 6 Months)

Each of the prepared compositions for surface treatment was stored in a vacuum container (compact vacuum container NT-20R manufactured by AS ONE Corporation) as a sealed container for 6 months under an environment of 25° C. so that the concentration of the dissolved gas did not change after preparation and until use, thereby preparing each composition for surface treatment after storage.

Next, the substrate surface on the TEOS-SiO$_2$ film side was polished in the same manner as the chemical mechanical polishing (CMP) step in the evaluation of the number of residues. Subsequently, in the rinse polishing treatment step in the evaluation of the number of residues, the rinse polishing treatment was performed in the same manner except that each composition for surface treatment after storage was used, and then cleaning and drying were performed in the same manner as in the water washing step in the evaluation of the number of residues. Here, after storage for 6 months, the time from when the sealed container was opened until the composition for surface treatment was placed in the polishing machine and used was within 30 minutes.

Then, the number of defects was evaluated in the same manner as in the measurement of the initial number of defects. The smaller the number of defects, the smaller the number of residues remaining on the substrate surface, and the number of defects was evaluated using the same evaluation criteria as in the "measurement of the initial number of defects". These results are shown in Table 1 below.

In Table 1 below, the increase rate (%) of the number of defects is a rate (%) of a value obtained by subtracting the initial number of defects (defects) from the number of defects (defects) after storage for 6 months relative to the initial number of defects (defects).

TABLE 1

Formulation of each composition for surface treatment and evaluation result of number of defects

| Composition for surface treatment | Water-soluble polymer | Content (mass %) | Dissolved gas concentration (mg/L) | pH Adjusting agent | pH | Initial number of defects (Defects) | Evaluation | Number of defects after storage for 6 months (Defects) | Evaluation | Increase rate (%) of number of defects | Remarks |
|---|---|---|---|---|---|---|---|---|---|---|---|
| 1 | Polyvinyl alcohol | 0.20 | 10 | Maleic acid | 5 | 3476 | ○ | 3828 | △ | 10.13 | Present invention |
| 2 | Polyvinyl alcohol | 0.20 | 7 | Maleic acid | 5 | 3484 | ○ | 3804 | △ | 9.18 | Present invention |
| 3 | Polyvinyl alcohol | 0.20 | 4 | Maleic acid | 5 | 3529 | ○ | 3709 | △ | 5.10 | Present invention |
| 4 | Polyvinyl alcohol | 0.20 | 1 | Maleic acid | 5 | 3561 | ○ | 3601 | ○ | 1.12 | Present invention |
| 5 | Polyvinyl alcohol | 0.20 | 0.1 | Maleic acid | 5 | 3577 | ○ | 3589 | ○ | 0.34 | Present invention |
| 6 | Polyvinyl alcohol | 0.20 | 0.01 | Maleic acid | 5 | 3659 | △ | 3668 | △ | 0.25 | Present invention |
| 7 | Polyvinyl alcohol | 0.20 | 0.005 | Maleic acid | 5 | 3911 | × | 3912 | × | 0.03 | Comparative Example |
| 8 | Polyvinyl alcohol | 0.20 | 20 | Maleic acid | 5 | 3428 | ○ | 4523 | × | 31.94 | Comparative Example |

From the results in Table 1 above, it was confirmed that compositions 1 to 6 for surface treatment in which the concentration of the dissolved gas was 0.01 mg/L or more and 10 mg/L or less with respect to the total volume of the composition for surface treatment had a small initial number of defects and a small increase rate of the number of defects, and was excellent in both residue removing effect and storage stability. On the other hand, it was confirmed that composition 7 for surface treatment in which the concentration of the dissolved gas was less than 0.01 mg/L with respect to the total volume of the composition for surface treatment had a large initial number of defects and was poor in residue removing effect. In addition, it was confirmed that composition 8 for surface treatment in which the concentration of the dissolved gas was more than 10 mg/L with respect to the total volume of the composition for surface treatment had a large increase rate of the number of defects and was poor in storage stability.

In addition, from the comparison among compositions to 8 for surface treatment, it was confirmed that, when the concentration of the dissolved gas decreased, the storage stability was improved, and the residue reducing effect was reduced. Here, among the compositions 1 to 6 for surface treatment according to the present invention, it was confirmed that composition 4 for surface treatment in which the concentration of the dissolved gas was 0.1 mg/L with respect to the total volume of the composition for surface treatment and composition 5 for surface treatment in which the concentration of the dissolved gas was 1 mg/L achieved both the storage stability and the residue reducing effect at a high level, and exhibited particularly excellent characteristics in comprehensive evaluation.

The present application is based on Japanese Patent Application No. 2019-058832 filed on Mar. 26, 2019, the disclosure content of which is incorporated by reference in its entirety.

The invention claimed is:

1. A composition for surface treatment, wherein:
   the composition comprises a solvent, a water-soluble polymer, and a dissolved gas;
   the dissolved gas comprises clean air;
   a concentration of the dissolved gas is 0.01 mg/L or more and 10 mg/L or less with respect to a total volume of the composition;
   the composition has a pH of 7 or less; and
   the composition is used for reducing residues on a surface of a chemically mechanically polished object.

2. A method for producing the composition for surface treatment according to claim 1, comprising setting the concentration of the dissolved gas to 0.01 mg/L or more and 10 mg/L or less with respect to the total volume of the composition.

3. A surface treatment method comprising:
   using the composition for surface treatment according to claim 1 to subject a chemically mechanically polished object to a surface treatment, thereby reducing residues on a surface of the chemically mechanically polished object.

4. The surface treatment method according to claim 3, wherein the surface treatment is performed by a rinse polishing treatment or a cleaning treatment.

5. A method for producing a semiconductor substrate, the method comprising:
   a surface treatment step of reducing residues on a surface of a chemically mechanically polished object by the surface treatment method according to claim 3,
   wherein the chemically mechanically polished object is a chemically mechanically polished semiconductor substrate.

6. A surface treatment method comprising:
   producing a composition for surface treatment by the method according to claim 2, and using the produced composition for surface treatment to subject a chemically mechanically polished object to a surface treatment, thereby reducing residues on a surface of the chemically mechanically polished object.

7. The surface treatment method according to claim 6, wherein the surface treatment is performed by a rinse polishing treatment or a cleaning treatment.

8. A method for producing a semiconductor substrate, the method comprising:
   a surface treatment step of reducing residues on a surface of a chemically mechanically polished object by the surface treatment method according to claim 6, wherein the chemically mechanically polished object is a chemically mechanically polished semiconductor substrate.

9. The composition according to claim 1, wherein the dissolved gas is clean air.

10. The composition according to claim 1, wherein the concentration of the dissolved gas is 7 mg/L or more and 10 mg/L or less with respect to the total volume of the composition.

11. The composition according to claim 1, wherein the water-soluble polymer comprises a hydroxyl group.

12. The composition according to claim 1, wherein the water-soluble polymer is a vinyl alcohol-based polymer.

13. The composition according to claim 1, wherein the water-soluble polymer is polyvinyl alcohol.

* * * * *